(12) United States Patent
Chen et al.

(10) Patent No.: US 7,030,622 B2
(45) Date of Patent: Apr. 18, 2006

(54) BONDING CONFIGURATION STRUCTURE FOR FACILITATING ELECTRICAL TESTING IN A BONDING PROCESS AND A TESTING METHOD USING THE SAME

(75) Inventors: Hui-Chang Chen, Kaohsiung (TW); Chun-Yu Lee, Sinying (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 11/049,158

(22) Filed: Feb. 2, 2005

(65) Prior Publication Data
US 2006/0017448 A1 Jan. 26, 2006

(30) Foreign Application Priority Data
Jul. 26, 2004 (TW) ............... 93122335 A

(51) Int. Cl.
*G01R 31/02* (2006.01)
*B23K 1/19* (2006.01)

(52) U.S. Cl. ....................... 324/538; 228/103

(58) Field of Classification Search ............ None
See application file for complete search history.

(56) References Cited

U.S. PATENT DOCUMENTS

| | | | | |
|---|---|---|---|---|
| 5,517,752 | A * | 5/1996 | Sakata et al. | 29/832 |
| 6,241,146 | B1 * | 6/2001 | Wienand et al. | 228/248.1 |
| 2001/0019169 | A1 * | 9/2001 | Marino et al. | 257/673 |

\* cited by examiner

*Primary Examiner*—Vincent Q. Nguyen
(74) *Attorney, Agent, or Firm*—Thomas, Kayden, Horstemeyer & Risley

(57) ABSTRACT

A bonding configuration structure for facilitating electrical testing in a bonding process and a testing method are provided. The bonding configuration includes a bonded component, a bonding component, a bond portion and a leading component. The bonding component is disposed on the bonded component. The bonding component has a first end and a second end. The first end is coupled to the bond portion. The second end is disposed on the bonded component to form the first testing portion.

18 Claims, 7 Drawing Sheets

BONDING CONFIGURATION STRUCTURE
FOR FACILITATING ELECTRICAL TESTING
IN A BONDING PROCESS AND A TESTING
METHOD USING THE SAME

This application claims the benefit of Taiwan application Ser. No. 93122335, filed Jul. 26, 2004, the subject matter of which is incorporated herein by reference.

BACKGROUND OF THE INVENTION

1. Field of the Invention

The invention relates in general to a bonding configuration structure and a testing method thereof, and more particularly to a bonding configuration structure and a testing method for facilitating electrical testing in a bonding process.

2. Description of the Related Art

Currently, the liquid crystal display is gradually becoming the mainstream of all the displays, mainly because that the liquid crystal display occupied the smaller space than the conventional CRT display. However, the process of manufacturing the liquid crystal display is more complicated than that of manufacturing the CRT display. The reason for the above situation is that every steps of the procedure takes high skill and concern while producing the electrical product. The bonding process is a crucial process of the LCD manufacturing process and can be applied to the manufacturing process of Chip on Glass, Flexible Printed Circuit Board on Glass, Chip on Flexible Printed Circuit Board, and Flexible Printed Circuit Board on Printed Circuit Board. Traditionally, the quality of the bonding process is inspected manually with the naked eye and determined by checking the traces of the bond portion. However, qualitative determination by manual inspection without quantitative analysis is subjective. Typically, the quantitative test is at the later stage of the manufacturing process, which is after the process of bonding the printed circuit board. Therefore, the defects on the electrical product would not be found out until the later stage of the manufacturing process. As a result, the whole processes simply waste time and the cost. Additionally, manual inspection of the bonding process fails to automate the process.

SUMMARY OF THE INVENTION

It is therefore an object of the invention to provide a bonding configuration structure for facilitating electrical testing and a method thereof in the bonding process. By means of quantifying the electrical quality in every step of the bonding process, an automatic testing for the bonding process is achieved thereby improving the efficiency of testing and decreasing the cost of manufacturing.

According to one aspect of the present invention, a bonding configuration structure for testing electrical characteristics includes a bonded component, a bonding component, a bond portion and a leading component. The bonding component is disposed on the bonded component. The leading component has a first end and a second end. The first end is coupled to the bond portion and the second end is disposed on the bonded component to form a first testing portion.

According to one aspect of the present invention, a bonding configuration method in the bonding process is provided. The method includes the steps as follows: A bonded component and a bonding component are first provided. Next, a bond portion is formed on the bonding component, which the bond portion has an electric circuit. After that, the bond portion connects the bonded component and the bonding component. Next, a first end of a leading component is coupled to the bond portion, and a second end of the leading component is disposed on the bonded component to form a first testing portion. At last, the first testing portion is tested to determine a resistance value of the bond portion.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
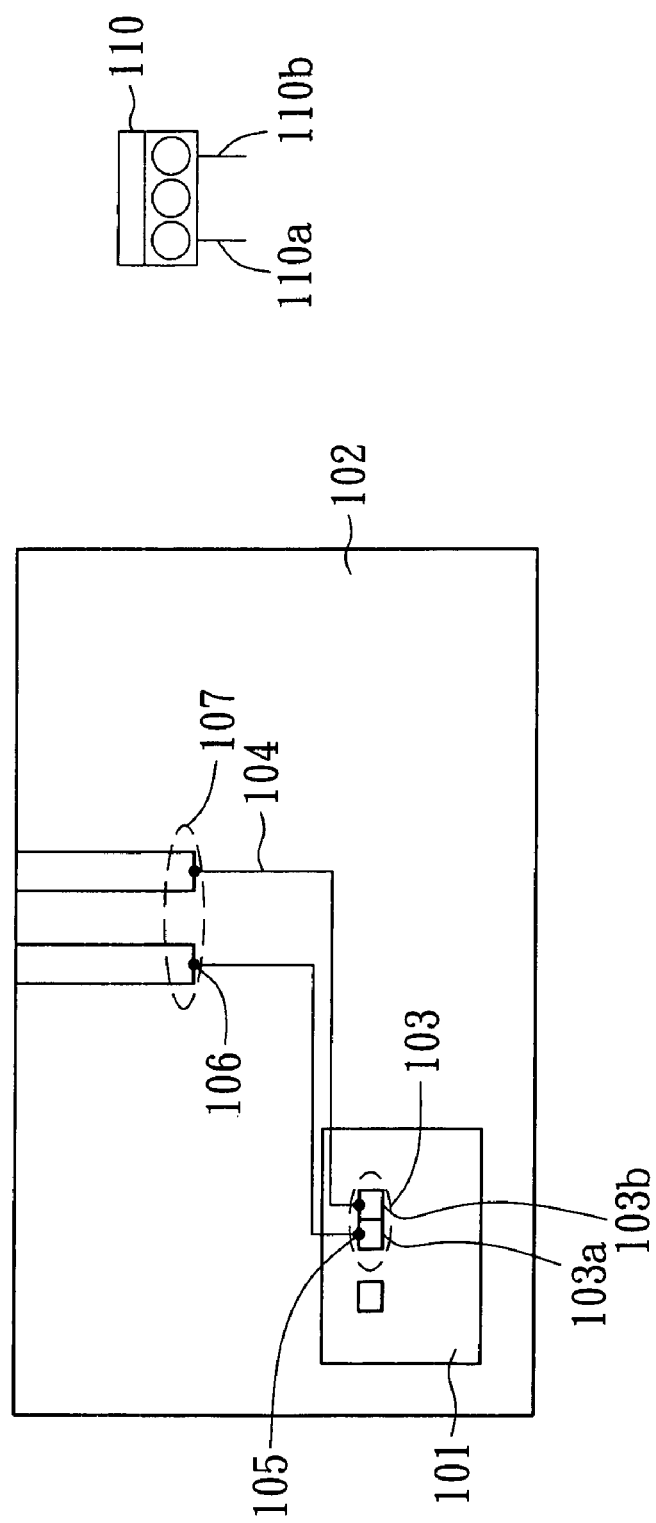
FIG. 1A is a top view of a bonding configuration structure in the bonding process according to a first embodiment.

Referring to FIG. 1A, a top view of a bonding configuration structure in the bonding process according to a first embodiment is shown. The bonding configuration structure 190 includes a bonded component, a bonding component, a bond portion 103, and a leading component 104. An electrical testing device 110 is also provided for testing the electrical characteristic of the bonding configuration structure 190. In the first embodiment, the bonded component is a glass substrate 102, and the bonding component is a driver integrated circuit 101. The leading component 104 has a first end 105 and a second end 106. The first end 105 is coupled to the bond portion 103, and the second end 106 is disposed on the glass substrate 102 to form a first testing portion 107. The first testing portion 107 can be a lead or a pin. The bond portion 107 connects the leading component 104 and the driver integrated circuit 101.

Figure 1B:
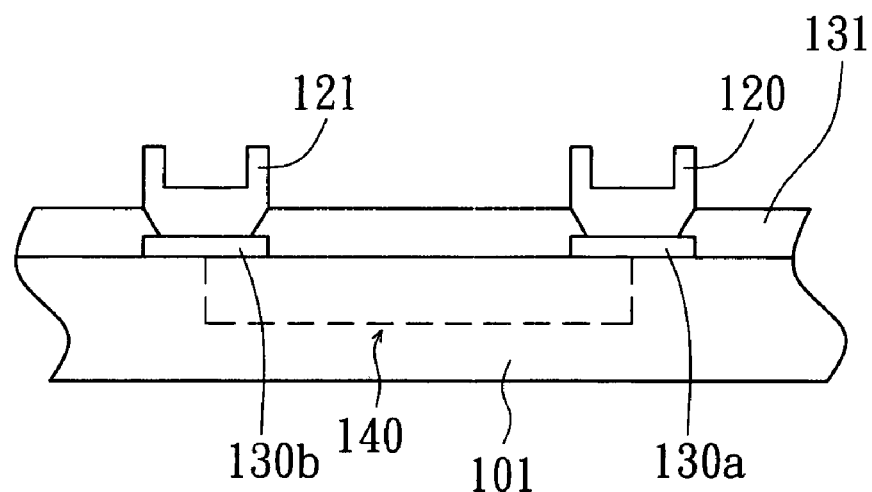
FIG. 1B is a cross-sectional view of a bond portion in FIG. 1A conducted by a conducting line.

Referring to FIG. 1B, a cross-sectional view of a bond portion in FIG. 1A conducted by a conducting line is shown. The bond portion 103 has a first bump 120, a second bump 121, a first pad 130a, a second pad 103b and a passivation layer 131. The first pad 130a and the second pad 130b are two dummy pads on the driver integrated circuit 101. By means of a conducting line 140 disposed within the driver integrated circuit 101, the first bump 120 and the second bump 121 form an electrical circuit. As shown in FIG. 1A, disposing the electrical testing device 110 on the first testing portion 107 can indirectly measure the resistance value between the driver integrated circuit 101 and the glass substrate 102; that is, the resistance value of the bond portion 103 can be measured.

Figure 1C:
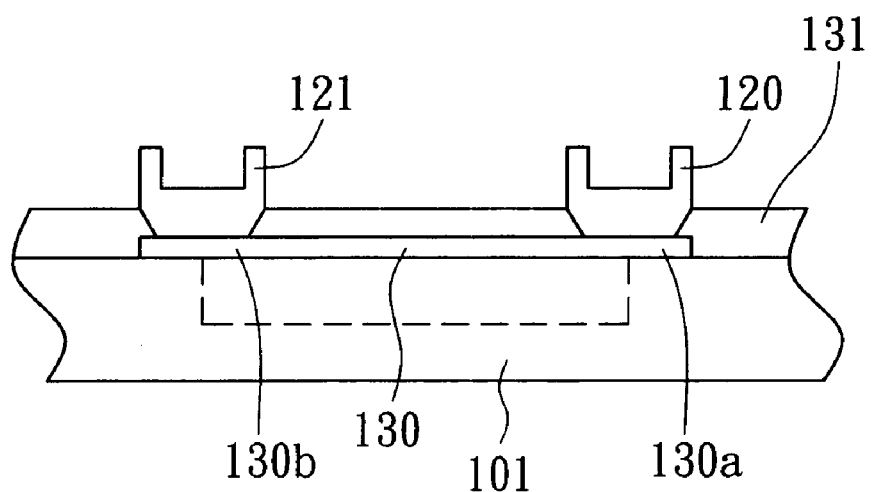
FIG. 1C is a cross-sectional view of a bond portion in FIG. 1A conducted by a pad.

Referring to FIG. 1C, a cross-sectional view of a bond portion in FIG. 1A conducted by a pad is shown. The first pad 130a and the second pad 130b disposed below the first bump 120 and the second bump 121 respectively, are extended to be a conducting pad 130. As shown in FIG. 1A, the first probe 110a and the second probe 110b are placed on the first testing portion 107 in order to measure the resistance value of the bond portion 103.

Figure 2:
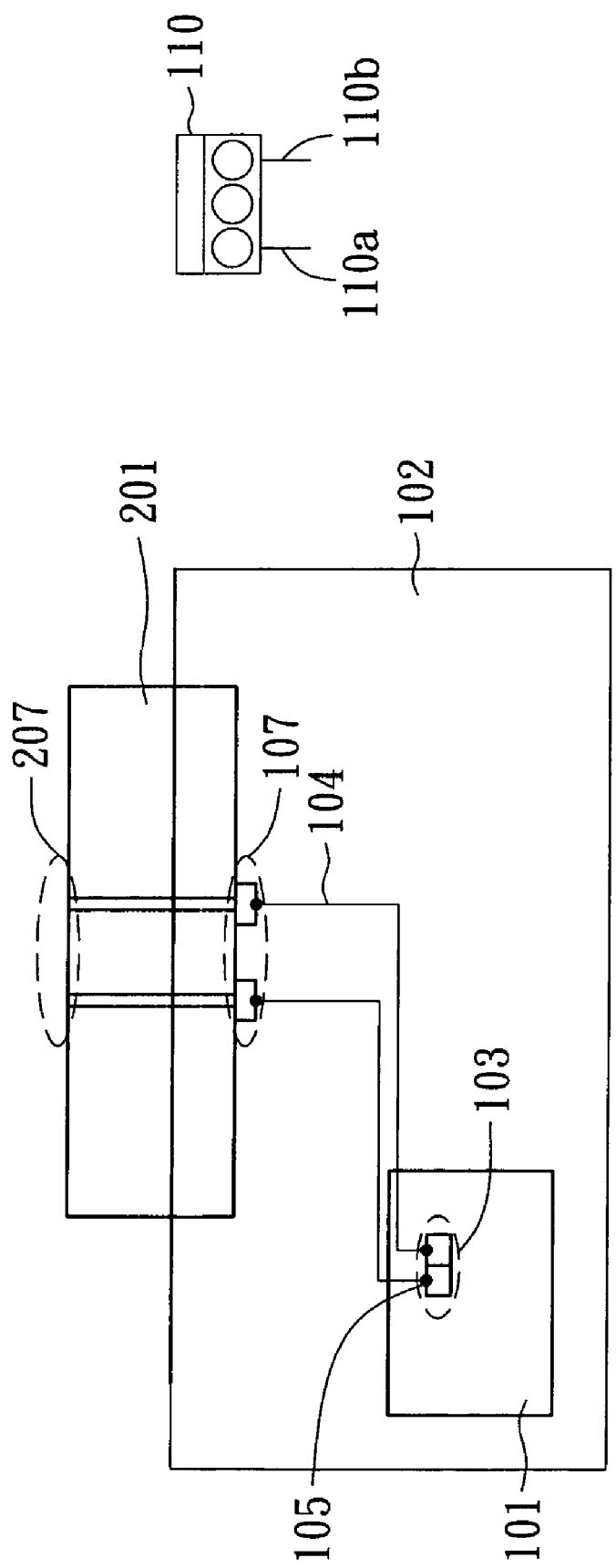
FIG. 2 is a top view of a bonding configuration structure in the bonding process according to a second embodiment.

Referring to FIG. 2, a top view of a bonding configuration structure in the bonding process according to a second embodiment is shown. In addition to bonding the driver integrated circuit 101 on the glass substrate 102 and forming the first testing portion 107 via the bond portion 107 and the leading component 104 as described in the first embodiment, the second embodiment includes bonding the flexible printed circuit board 201 to the glass substrate 102. The flexible printed circuit board 201 has a second testing portion 207 for being coupled to the first testing portion 107. The second portion 207 can be a lead or a pin. The electrical testing device 110 measures the resistance value of the bond portion 103 indirectly through the first testing portion 107 and the second testing portion 207. As shown in FIG. 2, the electrical testing device 110 disposed on the second testing portion measures a first resistance value between the driver integrated circuit 101 and the flexible printed circuit board 201. The first resistance value minus the resistance value between the flexible printed circuit board 201 and the glass substrate 102 is the resistance value between the driver integrated circuit 101 and the glass substrate 102. Therefore, the resistance value between the flexible printed circuit board 201 and the glass substrate 102 is obtained by disposing the electrical testing device 110 on the first testing portion 107 and the second testing portion 207 sequentially.

Figure 3:
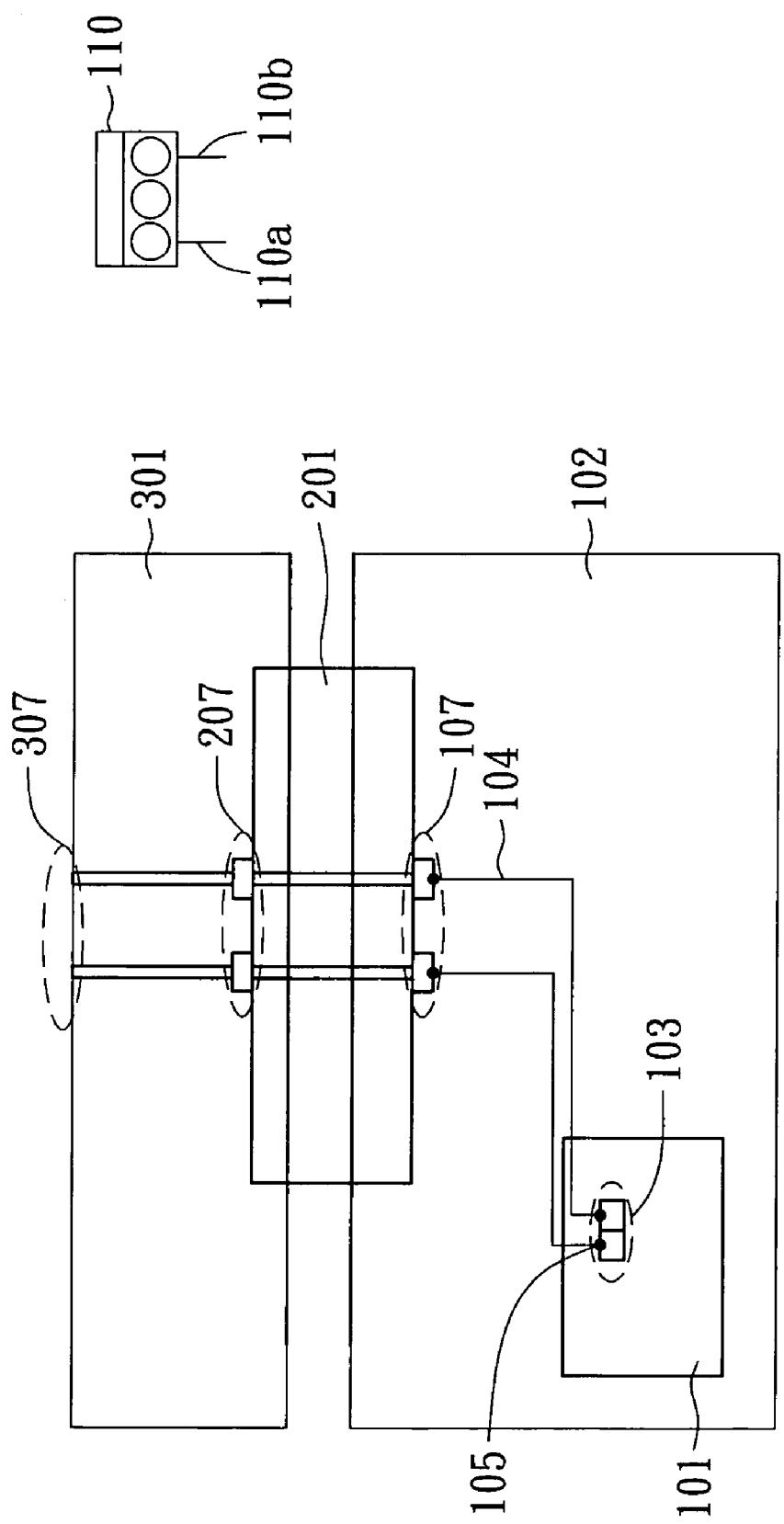
FIG. 3 is a top view of a bonding configuration structure in the bonding process according to a third embodiment.

Referring to FIG. 3, a top view of a bonding configuration structure in the bonding process according to a third embodiment is shown. In comparison to the first embodiment and the second embodiment, the structure of the third embodiment further includes bonding a printed circuit board to the flexible printed circuit board 201. In addition to bonding the driver integrated circuit 101 and the flexible printed circuit board to the glass substrate 102. The printed circuit board 301 has a third testing portion 307 coupled to the second testing portion 207. The third testing portion 307 can be a lead or a pin. The electrical testing device 110 measures the resistance of the first testing portion 107, the second testing portion 207 and the third testing portion 307 to indirectly measure the resistance of the bond portion 103. The electrical testing device is deposed on the first testing portion 107, the second testing portion 207 and the third testing portion 307 sequentially to indirectly measure the resistance of the bond portion 103. The second resistance value measured from the third testing portion 307 is the sum of the resistance value between the driver integrated circuit 101 and the glass substrate 102, the resistance value between the flexible printed circuit board 201 and the glass substrate 102, and the resistance value between the printed circuit board 301 and the flexible printed circuit board 201. Hence, subtracted the second resistance value by the resistance value between the glass substrate 102 and the flexible printed circuit board 201, the resistance value between the flexible printed circuit board 201 and the printed circuit board 301, the resistance value of the bond portion 103 is obtained. The resistance value of said bond portion 103 is the resistance value between the driver integrated circuit 101 bonded to the glass substrate 102. In the third embodiment, three different resistance values, which are the resistance value between the glass substrate 102 and the driver integrated circuit board 101, the resistance value between the flexible printed circuit board 201 and the glass substrate 102, and the resistance value between the flexible printed circuit board 201 and the printed circuit board 301 are obtained.

Figure 4A:
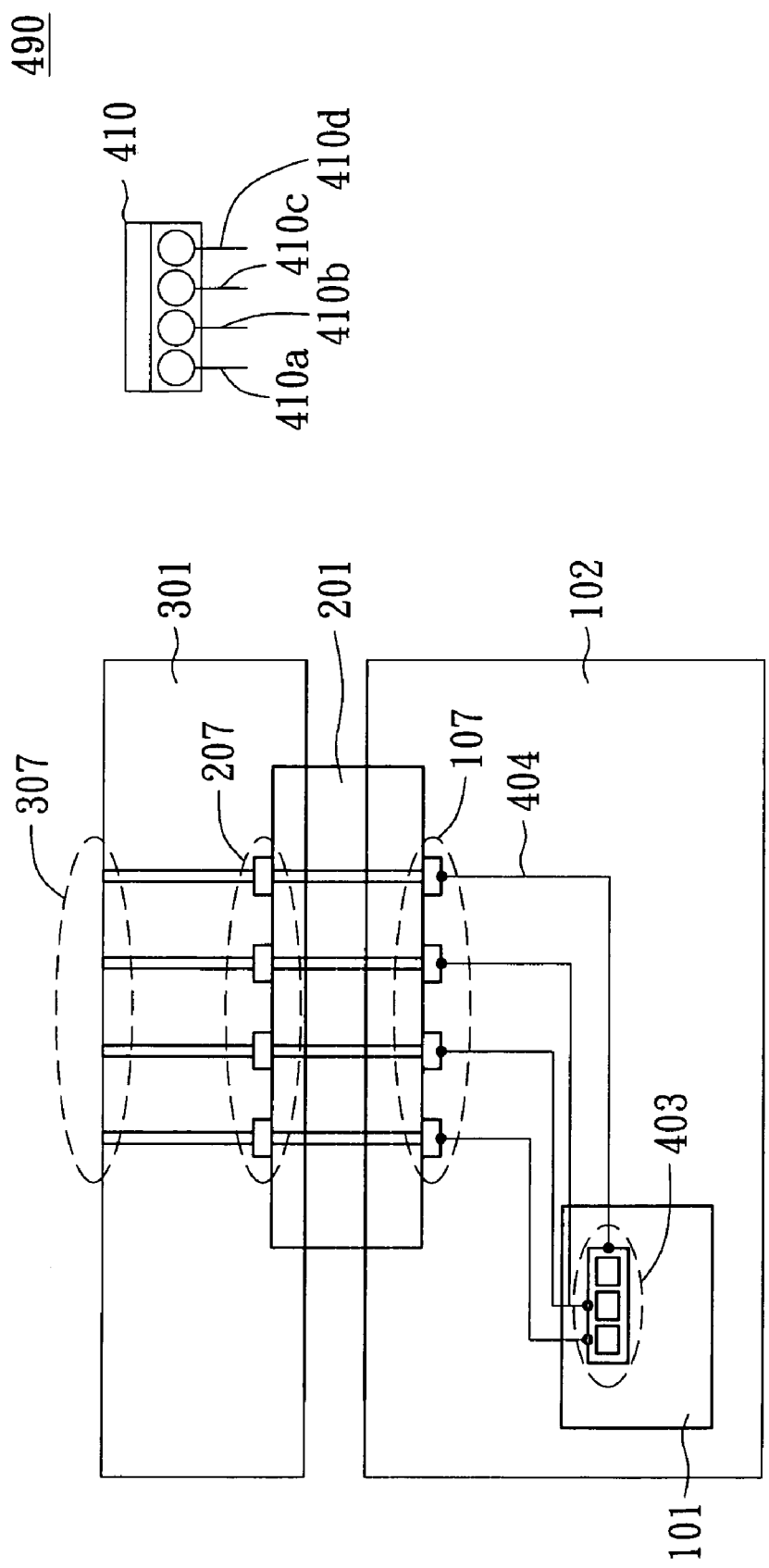
FIG. 4A is a top view of a bonding configuration structure with a four-point probe.
Figure 4B:
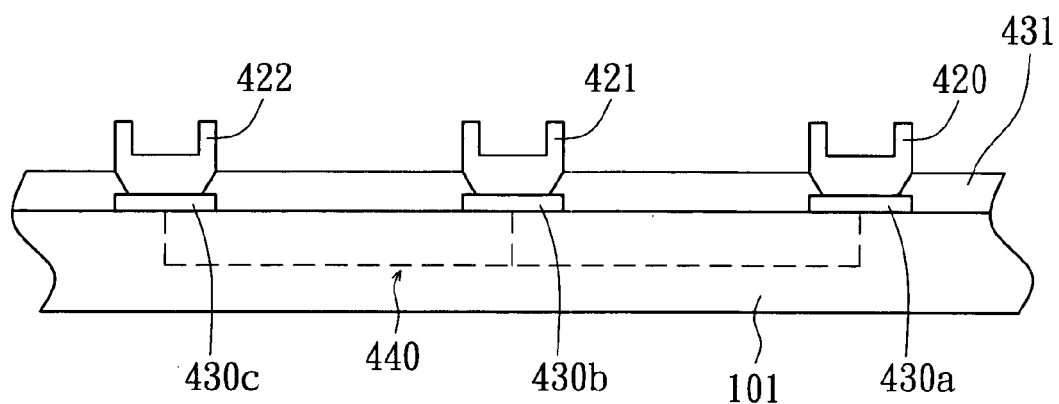
FIG. 4B is a cross-sectional view of a bond portion in FIG. 4A conducted by a pad.

Referring to FIG. 4A, a top view of a bonding configuration structure with a four-point probe is shown. The bonding configuration structure with a four-point probe 490 includes a glass substrate 102, a driver integrated circuit 101, a leading component 404, a flexible printed circuit board 201, a printed circuit board 301 and a four-point probe 410. The bond portion 403 has three dummy pads, 430a, 430b and 430c as shown in FIG. 4B. By means of these three dummy pads, the leading component 404 is coupled to the driver integrated circuit 101.

Referring to FIG. 4B, a cross-sectional view of a bond portion in FIG. 4A conducted by a pad is shown. The bond portion 403 has a first bump 420, a second bump 421, a third bump 422, a first pad 430a, a second pad 430b, a third pad 430c and a passivation layer 431. An electric circuit is formed by way of using the conducting line 440 to conduct the first bump 420, the second bump 421 and the third bump 422.

Figure 4C:
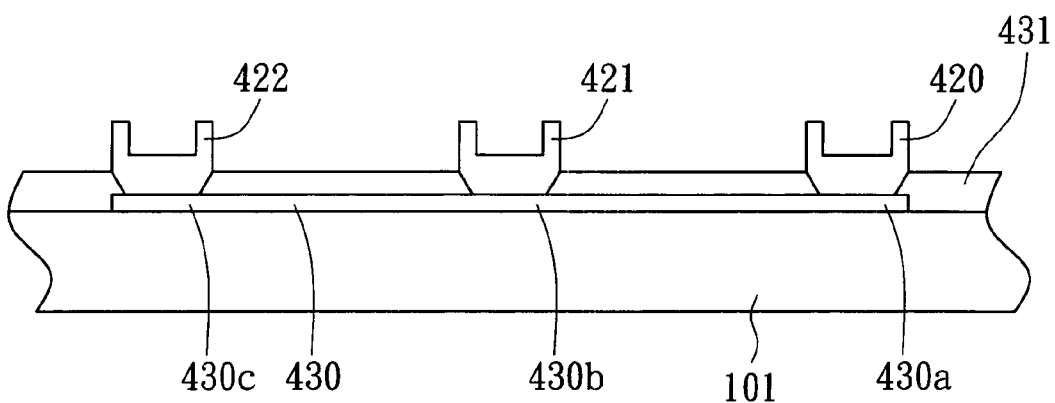
FIG. 4C is a cross-sectional view of a bond portion in FIG. 4A conducted by a conducting line.

Referring to FIG. 4C, a cross-sectional view of a bond portion in FIG. 4A conducted by a conducting line is shown. The first pad 430a disposed on the bottom side of the first bump 420, the second pad 430b disposed on the bottom side of the second bump 421 and the third pad 430c disposed on the bottom side of the third bump 422 are extended to be a conducting pad 430. As shown in FIG. 4A, disposing the four-point probe 410 on the first testing portion 107, the second testing portion 207, and the third testing portion 307 sequentially as described in the third embodiment can measure three different resistance values of the bonding process, which are the resistance value between the glass substrate 102 and the driver integrated circuit 101, the resistance value of flexible printed circuit board 201 and the printed circuit board 301. In the fourth embodiment, measurement by using the bonding configuration structure with a four-point probe 490 is more precise than by using the bonding configuration structure 190 of the first embodiment, the second embodiment and the third embodiment.

Figure 5:
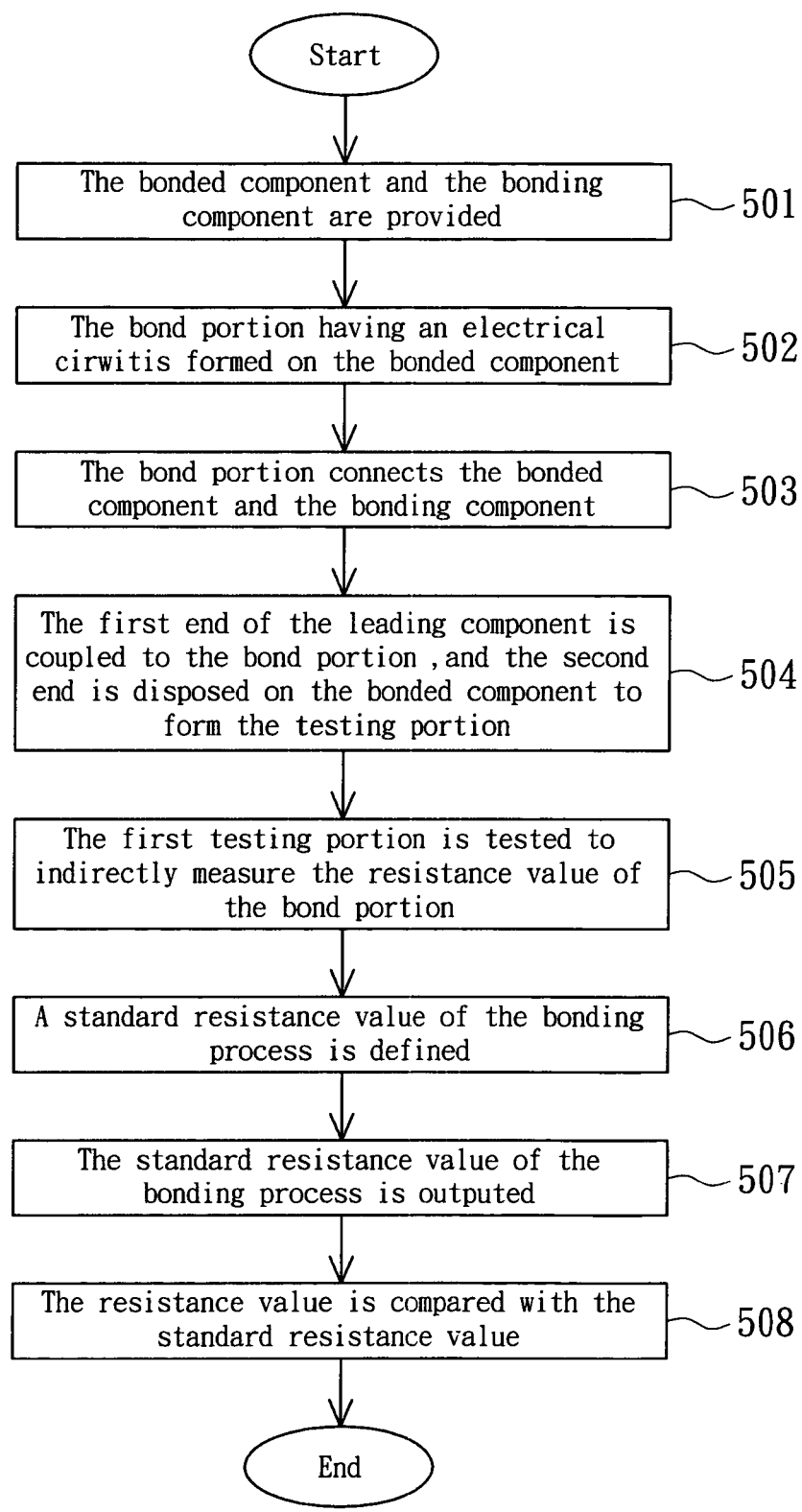
FIG. 5 is a flow chart showing a bonding configuration method in the bonding process.

Referring to FIG. 5, a flow chart shows a bonding configuration method in the bonding process. First, in step 501, the bonded component and the bonding component are provided. Then, in step 502, the bond portion 103 having an electrical circuit is formed on the bonded component. Next, in step 503, the bond portion 103 connects the bonded component and the bonding component. After that, in step 504, the first end 105 of the leading component 104 is coupled to the bond portion 103, and the second end 106 is disposed on the bonded component to form the first testing portion 107. Then, in step 505, the first testing portion 107 is tested to determine the resistance value of the bond portion 103. Next, in step 506, a standard resistance value of the bonding process is defined. After that, in step 507, the standard resistance value of the bonding process is outputted. At last, in step 508, the resistance value of the bond portion 103 is compared with the standard resistance value.

The bonding configuration structure and the method thereof in the bonding process disclosed in the above embodiments can monitor the electrical quality through measuring the resistance value of the bond portion 103 where the bonding component is bonded on the bonded component. Even if there are modifications of the product design, for instance, the lead pitch is narrowed, the bonding configuration structure and the method could be criteria for validation. In order to save the time and the cost, the inferior product produced at the earlier stage of the manufacturing process may be recycled to be an electrical reference to related manufacturing processes of testing the materials, such as the Anisotropic Conductive Film, to reduce the cost of developing the testing chips. Further, the bonding configuration structure and the method thereof according to the invention provide quantitative determination, thereby saving the time, automating the bonding process, and improving the measurement efficiency.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A bonding configuration structure for facilitating electrical testing in a bonding process, comprising:
    a bonded component;
    a bonding component, disposed on the bonded component;
    a bond portion, for connecting the bonding component and the bonded component;
    a leading component having a first end and a second end, the first end being coupled to the bond portion, and the second end being disposed on the bonded component to form a first testing portion; and
    a flexible printed circuit board bonded on the bonded component, the flexible printed circuit board having a second testing portion coupled to the first testing portion.

2. The bonding configuration structure according to claim 1, wherein the bond portion comprises a first bump and a second bump, and the first bump and the second bump are electrically connected.

3. The bonding configuration structure according to claim 2, wherein the bonded component comprises a conducting line for connecting the first bump and the second bump to form an electrical circuit.

4. The bonding configuration structure according to claim 2, wherein the bonded component comprises a pad disposed on the bonding component for connecting the first bump and the second bump to form an electric circuit.

5. The bonding configuration structure according to claim 1, wherein the first testing portion is a lead or a pin.

6. The bonding configuration structure according to claim 1, wherein the bonded component is a glass substrate.

7. The bonding configuration structure according to claim 1, wherein the bonding component is a driver integrated circuit.

8. The bonding configuration structure according to claim 1, wherein the second testing portion is a lead or a pin.

9. The bonding configuration structure according to claim 1, further comprising a printed circuit board bonded on the flexible printed circuit, the printed circuit board having a third testing portion for being coupled to the second testing portion.

10. The bonding configuration structure according to claim 9, wherein the testing portion is a lead or a pin.

11. A method for testing a bonding configuration, comprising:
    providing a bonded component and a bonding component;
    forming a bond portion on the bonding component, wherein the bond portion has an electrical circuit;
    connecting the bonded component and the bonding component via the bond portion;
    coupling a first end of a leading component to the bond portion;
    disposing a second end of the leading component on the bonded component to form a first testing portion;
    providing a flexible printed circuit board, the flexible printed circuit board having a second testing portion;
    bonding the flexible printed circuit board to the bonded component for coupling the second testing portion and the first testing portion; and
    measuring a resistance value of the bond portion indirectly through the first testing portion and the second testing portion.

12. The method according to claim 11, further comprising:
    defining a standard resistance value;
    outputting the resistance value of the bond portion; and
    comparing the resistance value and the standard resistance value.

13. The method according to claim 11, wherein the bond portion comprises a first bump and a second bump, and the first bump and the second bump are conducted.

14. The method according to claim 13, further comprising:
    forming a conducting line on the bonding component;
    disposing the first bump and the second bump on the conducting line to form the electrical circuit.

15. The method according to claim 11, further comprising:
    forming a pad on the bonded component; and
    disposing the first bump and the second bump on the pad to form the electrical circuit.

16. The method according to claim 11, wherein the bonded component is a glass substrate.

17. The method according to claim 11, wherein the bonding component is a driver integrated circuit.

18. The method according to claim 11, further comprising:
    providing a printed circuit board, the printed circuit board having a third testing portion;
    bonding the printed circuit board and the flexible printed circuit board so as to couple the third testing portion and the second testing portion; and
    determining the resistance value of the bond portion indirectly trough the first testing portion, the second testing portion, and the third testing portion.

* * * * *